(12) United States Patent
Stamper et al.

(10) Patent No.: US 10,263,013 B2
(45) Date of Patent: Apr. 16, 2019

(54) METHOD OF FORMING AN INTEGRATED CIRCUIT (IC) WITH HALLOW TRENCH ISOLATION (STI) REGIONS AND THE RESULTING IC STRUCTURE

(71) Applicant: GLOBALFOUNDRIES INC., Grand Cayman (KY)

(72) Inventors: Anthony K. Stamper, Burlington, VT (US); Steven M. Shank, Jericho, VT (US); Siva P. Adusumilli, South Burlington, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/441,711

(22) Filed: Feb. 24, 2017

(65) Prior Publication Data
US 2018/0247956 A1   Aug. 30, 2018

(51) Int. Cl.
*H01L 27/12*   (2006.01)
*H01L 21/762*   (2006.01)
(Continued)

(52) U.S. Cl.
CPC ...... *H01L 27/1211* (2013.01); *H01L 21/0217* (2013.01); *H01L 21/26513* (2013.01);
(Continued)

(58) Field of Classification Search
CPC ............. H01L 21/84; H01L 27/1203; H01L 29/66909; H01L 29/8083; H01L 21/823418; H01L 21/76224
(Continued)

(56) References Cited

U.S. PATENT DOCUMENTS

| 5,102,809 A * | 4/1992 | Eklund ............. H01L 21/76264 148/DIG. 150 |
| 5,482,871 A | 1/1996 | Pollack |

(Continued)

FOREIGN PATENT DOCUMENTS

TW    201603144    1/2016

OTHER PUBLICATIONS

H. Wang et al., "The behavior of narrow-width SOI MOSFETs with MESA isolation", IEEE Transactions on Electron Devices, vol. 47, Issue: 3, Mar 2000, Abstract, pp. 1-3.
(Continued)

*Primary Examiner* — David Chen
(74) *Attorney, Agent, or Firm* — Gibb & Riley, LLC; Michael J. LeStrange, Esq.

(57) ABSTRACT

Disclosed is an integrated circuit (IC) formation method, wherein trenches are formed within a semiconductor layer to define semiconductor mesa(s). Instead of immediately filling the trenches with an isolation material and performing a planarizing process to complete the STI regions prior to device formation, the method initially only form sidewall spacers within the trenches on the exposed sidewalls of the semiconductor mesa(s). After the sidewall spacers are formed, device(s) (e.g., field effect transistor(s), silicon resistor(s), etc.) are formed using the semiconductor mesa(s) and, optionally, additional device(s) (e.g., polysilicon resistor(s)) can be formed within the trenches between adjacent semiconductor mesas. Subsequently, middle of the line (MOL) dielectrics (e.g., a conformal etch stop layer and a blanket interlayer dielectric (ILD) layer) are deposited over the device(s), thereby filling any remaining space within the trenches and completing the STI regions. Also disclosed is an IC structure formed using the method.

9 Claims, 12 Drawing Sheets

(51) Int. Cl.
*H01L 21/8234* (2006.01)
*H01L 21/02* (2006.01)
*H01L 21/84* (2006.01)
*H01L 49/02* (2006.01)
*H01L 21/265* (2006.01)
*H01L 29/08* (2006.01)
*H01L 29/45* (2006.01)
*H01L 27/06* (2006.01)
*H01L 29/06* (2006.01)

(52) U.S. Cl.
CPC .. *H01L 21/76224* (2013.01); *H01L 21/76283* (2013.01); *H01L 21/823431* (2013.01); *H01L 21/823437* (2013.01); *H01L 21/823468* (2013.01); *H01L 21/823481* (2013.01); *H01L 21/845* (2013.01); *H01L 27/0629* (2013.01); *H01L 28/20* (2013.01); *H01L 29/0649* (2013.01); *H01L 29/0847* (2013.01); *H01L 29/45* (2013.01); *H01L 27/1203* (2013.01)

(58) Field of Classification Search
USPC ........ 438/153, 157, 164, 192, 283, 294, 296
See application file for complete search history.

(56) References Cited

U.S. PATENT DOCUMENTS

| | | | |
|---|---|---|---|
| 5,831,347 A | 11/1998 | Landis et al. | |
| 5,904,535 A * | 5/1999 | Lee | H01L 21/8249 257/E21.696 |
| 6,509,583 B1 * | 1/2003 | Iwamatsu | H01L 21/76297 257/347 |
| 7,358,571 B2 | 4/2008 | Ko et al. | |
| 8,383,490 B2 | 2/2013 | Fan et al. | |
| 8,765,491 B2 | 7/2014 | Cai et al. | |
| 9,136,386 B2 | 9/2015 | Okihara | |
| 2005/0026390 A1 | 2/2005 | Chi | |
| 2006/0022270 A1 | 2/2006 | Boyd et al. | |
| 2007/0218616 A1 | 9/2007 | Parekh | |
| 2007/0254464 A1 * | 11/2007 | Greene | H01L 29/458 438/581 |
| 2008/0203477 A1 * | 8/2008 | Yamazaki | H01L 27/105 257/347 |
| 2009/0039421 A1 * | 2/2009 | Otake | H01L 29/66666 257/329 |
| 2011/0272700 A1 * | 11/2011 | Yamaguchi | H01L 27/12 257/66 |
| 2014/0361349 A1 * | 12/2014 | Alexandrov | H01L 29/8083 257/263 |
| 2015/0194501 A1 * | 7/2015 | Yin | H01L 29/66545 438/300 |
| 2015/0236019 A1 * | 8/2015 | Basker | H01L 27/0924 257/401 |

OTHER PUBLICATIONS

Taiwan Application No. 106128588, Examination Report dated Sep. 18, 2018 and Search Report dated Sep. 17, 2018, pp. 1-8.

* cited by examiner

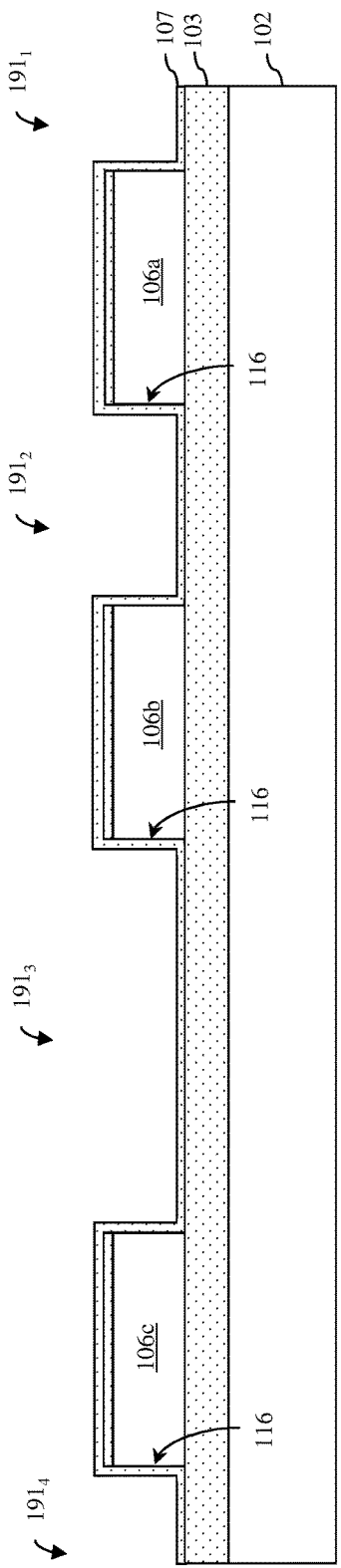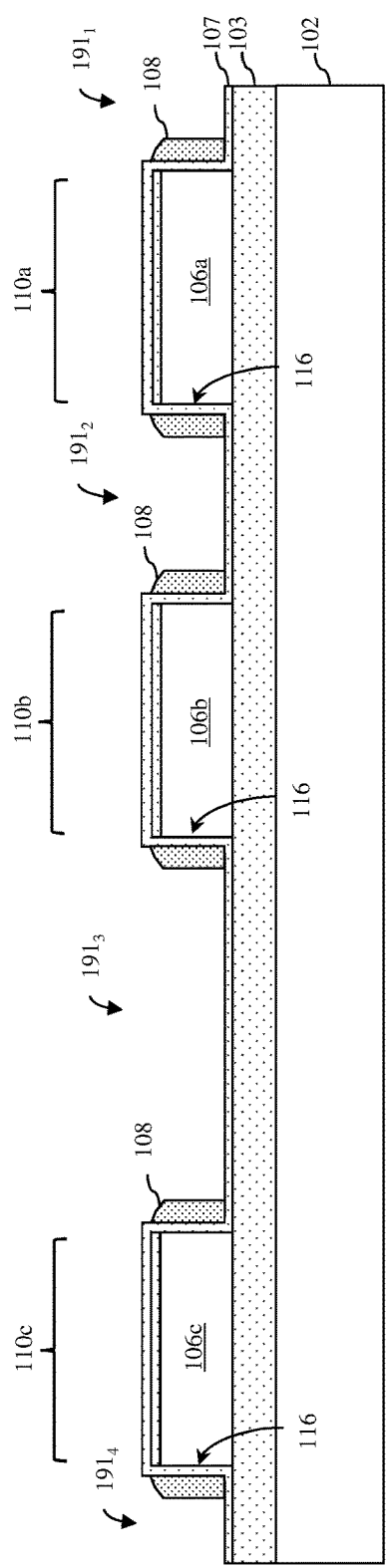
FIG. 4
FIG. 5

METHOD OF FORMING AN INTEGRATED CIRCUIT (IC) WITH HALLOW TRENCH ISOLATION (STI) REGIONS AND THE RESULTING IC STRUCTURE

BACKGROUND

Field of the Invention

The present invention relates to integrated circuits (ICs) and, more particularly, to an improved method of forming an integrated circuit (IC) structure with shallow trench isolation (STI) regions and the resulting IC structure.

Description of Related Art

More specifically, in conventional integrated circuit (IC) processing using semiconductor-on-insulator wafers (e.g., silicon-on-insulator (SOI) wafers), semiconductor mesas for device regions are defined by forming shallow trench isolation (STI) regions. Specifically, such processing begins with a semiconductor-on-insulator wafer, which includes a semiconductor substrate (e.g. a silicon substrate), an insulator layer (e.g., a buried oxide (BOX) layer) on the semiconductor substrate and a semiconductor layer (e.g., a silicon layer) on the insulator layer. The semiconductor layer is lithographically patterned and etched to form trenches, which extend vertically or nearly vertically through the semiconductor layer to or into the insulator layer and which laterally surround semiconductor mesas for device regions within the semiconductor layer. Isolation material (e.g., silicon oxide) is then deposited to fill the trenches and a planarizing process (e.g., a chemical mechanical polishing (CMP) process) is performed in order to remove the isolation material from the top surface of the semiconductor semiconductor mesas, thereby forming the STI regions. Semiconductor devices (e.g., field effect transistors (FETs), bipolar junction transistors (BJTs), diodes, etc.) are subsequently formed in the semiconductor mesas and the STI regions provide for electrical isolation. Unfortunately, IC processing that includes this type of STI formation can be costly and time consuming. Therefore, there is a need in the art for an improved method of forming an integrated circuit (IC) structure with shallow trench isolation (STI) regions.

SUMMARY

In view of the foregoing, disclosed herein are embodiments of a method of forming an integrated circuit (IC) structure with sidewall spacer and middle of the line (MOL) dielectric-containing shallow trench isolation (STI) regions. Specifically, in the method, trenches can be formed within a semiconductor layer to define at least one semiconductor mesa. Instead of immediately filling the trenches with an isolation material and performing a planarizing process (e.g., a chemical mechanical polishing (CMP) process) to complete the STI regions prior to device formation, the method initially only form sidewall spacers within the trenches on the exposed sidewalls of the semiconductor mesa(s). After the sidewall spacers are formed, device(s) (e.g., field effect transistor(s), bipolar junction transistor(s), heterojunction bipolar transistor(s), capacitor(s), resistor(s), etc.) can be formed using the semiconductor mesa(s) and, optionally, additional device(s) (e.g., resistor(s)) can be formed within the trenches between adjacent semiconductor mesas. Subsequently, middle of the line (MOL) dielectrics (e.g., a conformal etch stop layer and a blanket interlayer dielectric (ILD) layer) can be deposited over the devices and into any remaining spaces within the trenches, thereby completing the STI regions. Also disclosed herein are embodiments of an IC structure formed using the above-described method.

Generally, disclosed herein are embodiments of a method of forming an integrated circuit (IC) structure with sidewall spacer and middle of the line (MOL) dielectric-containing shallow trench isolation (STI) regions. The method includes forming trenches in a semiconductor layer to define at least one semiconductor mesa, having first sidewalls. First sidewall spacers can be formed within the trenches so as to be positioned laterally adjacent to the first sidewalls of the semiconductor mesa. After the first sidewall spacers are formed, but before the trenches are completely filled, a semiconductor device (e.g., a field effect transistor (FET), a resistor, etc.) can be formed using the semiconductor mesa. After the semiconductor device has been completed, at least one middle of the line (MOL) dielectric layer (e.g., a blanket interlayer dielectric (ILD) layer) can be deposited over the semiconductor device and into any remaining spaces within the trenches. It should be noted that the first sidewall spacers and the blanket ILD layer could be made of different dielectric materials.

More particularly, one embodiment of the method disclosed herein can include providing a semiconductor-on-insulator wafer that includes a substrate, an insulator layer on the substrate and a semiconductor layer on the insulator layer. Trenches can be formed in the semiconductor layer to define multiple semiconductor mesas, having first sidewalls, on the insulator layer. First sidewall spacers can be formed within the trenches so as to be positioned laterally adjacent to the first sidewalls of the semiconductor mesas. After the first sidewall spacers are formed, but before the trenches are completely filled, various different types of semiconductor devices (e.g., one or more FETs, one or more resistors, etc.) can be formed using the semiconductor mesas. Optionally, while the semiconductor devices are being formed within the semiconductor mesas, additional device(s) (e.g., resistor(s)) can be formed within any of the trenches so as to be positioned laterally between adjacent semiconductor mesas. After the semiconductor devices and optional additional device(s) have been completed, one or more middle of the line (MOL) dielectric layers (e.g., a conformal etch stop layer followed by a blanket interlayer dielectric (ILD) layer) can be deposited over the semiconductor devices and any additional device(s) and into any remaining spaces within the trenches. Again, the first sidewall spacers and the blanket ILD layer can be made of different dielectric materials.

Also disclosed herein are embodiments of an integrated circuit (IC) structure formed according to the above-described method so as to have sidewall spacer and middle of the line (MOL) dielectric-containing shallow trench isolation (STI) regions. Generally, the IC structure disclosed herein can have trenches extending vertically through a semiconductor layer. These trenches can define at least one semiconductor mesa. First sidewall spacers can be within the trenches positioned laterally adjacent to first sidewalls of the semiconductor mesa(s). The IC structure can further include at least one semiconductor device (e.g., a field effect transistor, a resistor, etc.) formed using the at least one semiconductor mesa. For example, the IC structure can include multiple semiconductor devices of the same or different types, wherein each semiconductor device is contained in whole or in part in a semiconductor mesa. Optionally, the IC structure can also include additional device(s) (e.g., resistor(s)) within any of the trenches positioned laterally between adjacent semiconductor mesas. Additionally, at least one middle of the line dielectric layer (e.g., a blanket interlayer dielectric (ILD) layer) can over the semiconductor device(s) and additional device(s) and in any remaining space within the trenches. As mentioned above with regard to the method, the first sidewall spacers and the blanket ILD layer can be made of different dielectric materials.

BRIEF DESCRIPTION OF THE SEVERAL VIEWS OF THE DRAWINGS

The present invention will be better understood from the following detailed description with reference to the drawings, which are not necessarily drawn to scale and in which:

FIG. 4 is a cross-section diagram illustrating a partially completed structure formed according to the flow diagram of FIG. 1;

FIG. 5 is a cross-section diagram illustrating a partially completed structure formed according to the flow diagram of FIG. 1;

DETAILED DESCRIPTION

As mentioned above, in conventional integrated circuit (IC) processing using semiconductor-on-insulator wafers (e.g., silicon-on-insulator (SOI) wafers), semiconductor mesas for device regions are defined by forming shallow trench isolation (STI) regions. Specifically, such processing begins with a semiconductor-on-insulator wafer, which includes a semiconductor substrate (e.g. a silicon substrate), an insulator layer (e.g., a buried oxide (BOX) layer) on the semiconductor substrate and a semiconductor layer (e.g., a silicon layer) on the insulator layer. The semiconductor layer is lithographically patterned and etched to form trenches, which extend vertically or nearly vertically through the semiconductor layer to or into the insulator layer and which laterally surround semiconductor mesas for device regions within the semiconductor layer. Isolation material (e.g., silicon oxide) is then deposited to fill the trenches and a planarizing process (e.g., a chemical mechanical polishing (CMP) process) is performed in order to remove the isolation material from the top surface of the semiconductor semiconductor mesas, thereby forming the STI regions. Semiconductor devices (e.g., field effect transistors (FETs), bipolar junction transistors (BJTs), diodes, etc.) are subsequently formed in the semiconductor mesas and the STI regions provide for electrical isolation. Unfortunately, IC processing that includes this type of STI formation can be costly and time consuming.

In view of the foregoing, disclosed herein are embodiments of a method of forming an integrated circuit (IC) structure with sidewall spacer and middle of the line (MOL) dielectric-containing shallow trench isolation (STI) regions. Specifically, in the method, trenches can be formed within a semiconductor layer to define at least one semiconductor mesa on an insulator layer. Instead of immediately filling the trenches with an isolation material and performing a planarizing process (e.g., a chemical mechanical polishing (CMP) process) to complete the STI regions prior to device formation, the method initially only form sidewall spacers within the trenches on the exposed sidewalls of the semiconductor mesa(s). After the sidewall spacers are formed, device(s) (e.g., field effect transistor(s), bipolar junction transistor(s), heterojunction bipolar transistor(s), capacitor(s), resistor(s), etc.) can be formed using the semiconductor mesa(s) and, optionally, additional device(s) (e.g., resistor(s)) can be formed within the trenches between adjacent semiconductor mesas. Subsequently, middle of the line (MOL) dielectrics (e.g., a conformal etch stop layer and a blanket interlayer dielectric (ILD) layer) can be deposited over the devices and into any remaining space within the trenches, thereby completing the STI regions. Also disclosed herein are embodiments of an IC structure formed using the above-described method.

Figure 1:
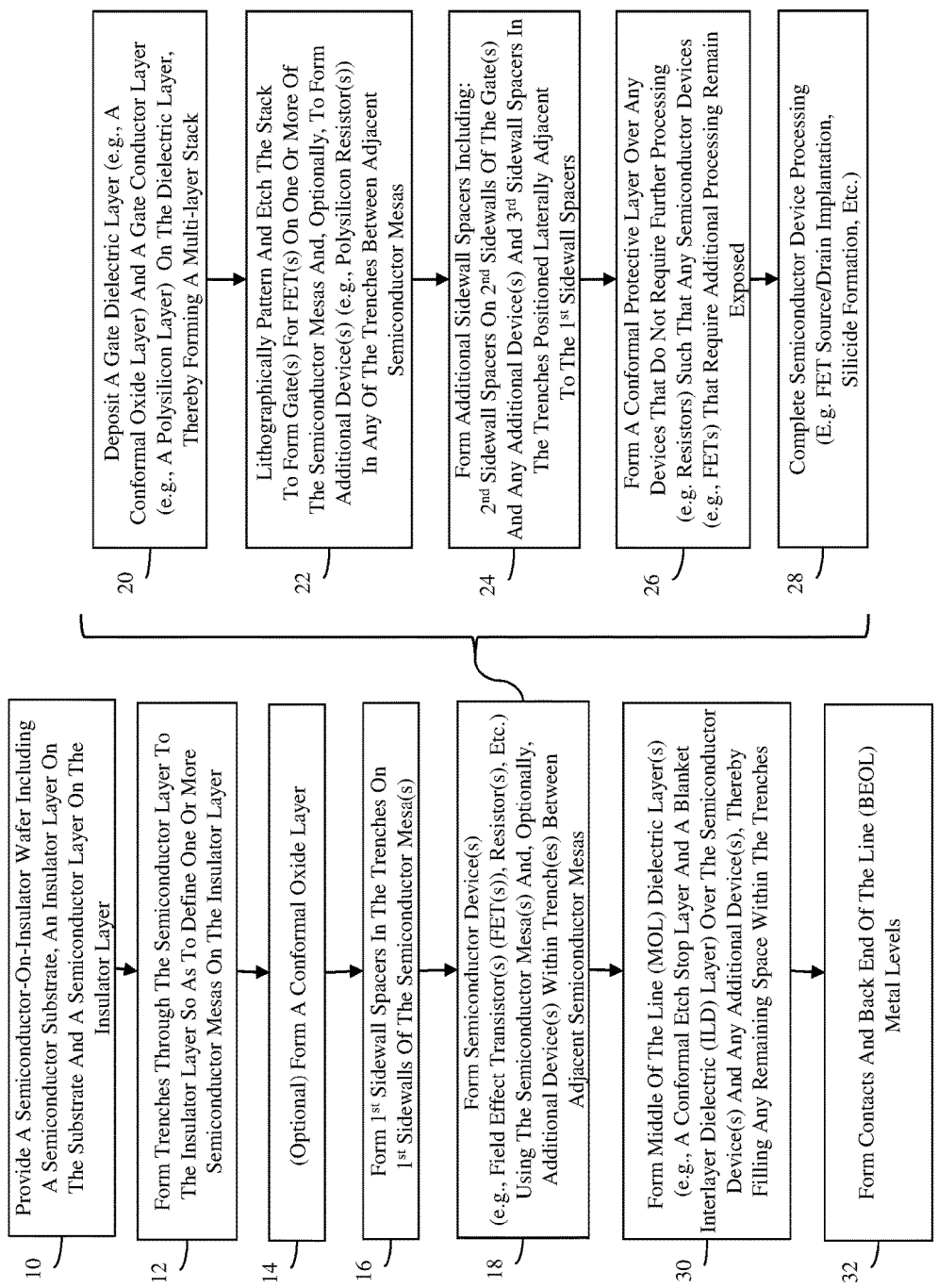
FIG. 1 is a flow diagram illustrating embodiments of a method of forming an integrated circuit (IC) structure with sidewall spacer and middle of the line (MOL) dielectric-containing shallow trench isolation (STI) regions.
Figure 2:
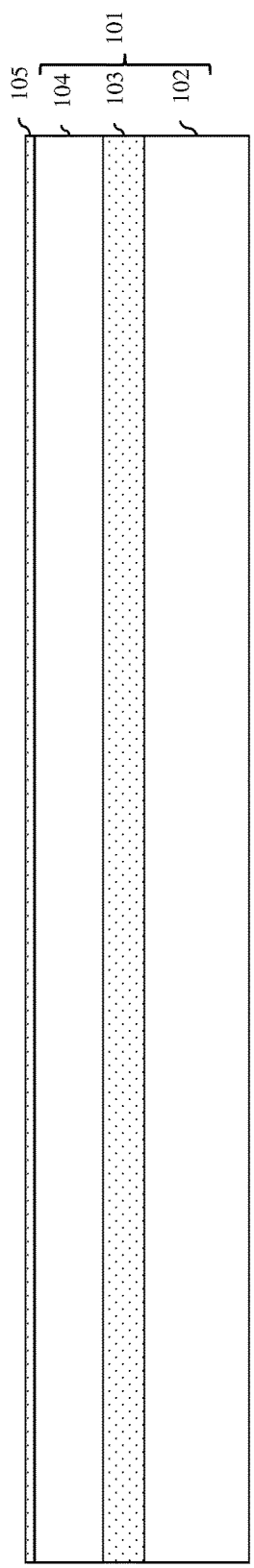
FIG. 2 is a cross-section diagram illustrating a partially completed structure formed according to the flow diagram of FIG. 1.

More particularly, referring to the flow diagram of FIG. 1, disclosed herein are embodiments of a method of forming an integrated circuit (IC) structure with sidewall spacer and middle of the line (MOL) dielectric-containing shallow trench isolation (STI) regions. The method begins with a semiconductor-on-insulator wafer 101 (e.g., a silicon-on-insulator (SOI) wafer or any other suitable semiconductor-on-insulator wafer) (10, see FIG. 2). Such a wafer 101 can include a substrate 102 (e.g., a silicon substrate or any other suitable substrate including, but not limited to, a silica glass substrate or a silicon carbide (SiC) substrate), an insulator layer 103 (e.g., a buried oxide (BOX) layer or other suitable insulator layer) on the substrate 102 and a semiconductor layer 104 (e.g., a silicon layer or any other suitable monocrystalline or polycrystalline semiconductor layer) on the insulator layer 103. Those skilled in the art will recognize that the required the thicknesses of the various layers in the wafer 101 may vary depending upon the application. For example, for radio frequency (RF) applications, the thickness of the semiconductor layer 104 may range from 50-150 nm; whereas, for conventional complementary metal oxide semiconductor (CMOS) applications, the thickness of the semiconductor layer 104 may range from 10-100 nm. In any case, prior to any additional processing, the wafer 101 can be cleaned and, optionally, a relatively thin sacrificial dielectric layer 105 on the top surface of the semiconductor layer 104. The sacrificial dielectric layer 105 can include, for example, one or more layers of silicon dioxide ($SiO_2$) or silicon nitride (SiN). The sacrificial dielectric layer 105 can be formed, for example, by thermal oxidation and/or chemical vapor deposition (CVD) so as to have a thickness of 5-50nm.

Figure 3:
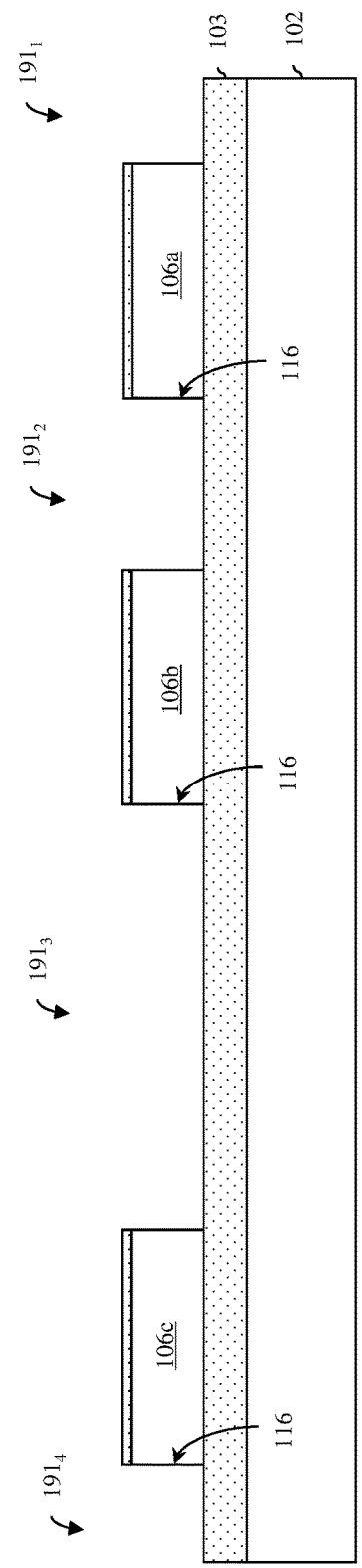
FIG. 3 is a cross-section diagram illustrating a partially completed structure formed according to the flow diagram of FIG. 1.

Trenches $191_1$-$191_4$, which extend essentially vertically through the sacrificial dielectric layer 105 and the semiconductor layer 104 at least to the insulator layer 103, can be formed (12, see FIG. 3). Specifically, such trenches $191_1$-$191_4$ can be formed using conventional lithographic patterning and etch processes in order to define one or more semiconductor mesas 106a-106c on the insulator layer 103. Etching of the trenches $191_1$-$191_4$ can stop on the top surface of the insulator layer 103 as illustrated or can extend some depth into the insulator layer 103 without exposing the top surface of the substrate 102. For purpose of this disclosure, a semiconductor mesa (also referred to herein a semiconductor body) is a discrete area of semiconductor material, which is patterned from the semiconductor layer and which can be used to form one or more semiconductor devices. These semiconductor devices can include active devices (e.g., field effect transistors (FETs), bipolar junction transistors (BJTs), heterojunction bipolar transistors (HBTs), etc.) and/or passive devices (e.g., resistors, capacitors, diodes, etc.). For purposes of illustration, FIG. 3 shows three semiconductor mesas (i.e., a first semiconductor mesa 106a, a second semiconductor mesa 106b, and a third semiconductor mesa 106c) defined by trenches $191_1$-$191_4$; however, it should be understood that FIG. 3 is not intended to be limiting and that process 12 can be performed so as to define any number of one or more semiconductor mesas. In any case, each semiconductor mesa 106a-106c can have first sidewalls 116 (i.e., vertical surfaces) defined by the trenches $191_1$-$191_4$.

Optionally, a relatively thin conformal oxide layer 107 can be formed so as to cover and be immediately adjacent to the top surface and first sidewalls of each semiconductor mesa 106a-106c and further so as to cover and be immediately adjacent to the exposed portions of the insulator layer 103 within the trenches $191_1$-$191_4$ (14, see FIG. 4). For example, a relatively thin silicon dioxide layer 107 (e.g., a 5-15 nm oxide layer) can be formed (e.g., by chemical vapor deposition (CVD)) over the semiconductor mesa(s) and insulator layer 103. Additionally or alternatively, a thermal oxide layer could be formed (e.g., by thermal oxidation) on the exposed sidewalls of the semiconductor mesas 106a-106c.

Next, first sidewall spacers 108 can be formed within the trenches $191_1$-$191_4$ so as to be positioned laterally adjacent to the first sidewalls 116 of each semiconductor mesa and, particularly, so as to laterally surround each semiconductor mesa and so as to protect and cover the first sidewalls 116 (i.e., the vertical surfaces) of each semiconductor mesa from insulator layer 103 to the top surface of the semiconductor mesa (16, see FIG. 5).

More specifically, a conformal layer of sidewall spacer material can be deposited (e.g., by chemical vapor deposition (CVD)) so as to cover the top surface and first sidewalls 116 of each semiconductor mesa 106a-106c and so as to cover the exposed portions of the insulator layer 103 within the trenches $191_1$-$191_4$. This sidewall spacer material can be, for example, silicon nitride, silicon oxynitride, silicon oxycarbide, alumina, or any other suitable dielectric material, which is different than the dielectric material of the insulator layer 103 and the dielectric material of the conformal oxide layer 107 (if present). The thickness of the conformal layer of sidewall spacer material can range, for example, from 20-100 nm. Following deposition of the sidewall spacer material, a selective anisotropic etch process can be performed so as to remove the sidewall spacer material from horizontal surfaces, leaving the sidewall spacer material on vertical surfaces. That is, the sidewall spacer material can be etched in at a significantly faster rate in a direction perpendicular to the top surface of the insulator layer 103 as compared to the direction parallel to the top surface of the insulator layer. Additionally, the sidewall spacer material can be etched selective to (i.e., etched at a significantly faster rate than) the insulator material of the insulator layer 103, the dielectric material of the conformal oxide layer 107 (if present) and the semiconductor material of the semiconductor mesas 106a-106c, thereby forming the first sidewall spacers 108 that are within the trenches $191_1$-$191_4$ and positioned laterally adjacent to the first sidewalls 116 of the semiconductor mesas 106a-106c, as illustrated. Alternatively, the selective anisotropic etch process could further etch through the conformal oxide layer 107 (if present) and, optionally, partially into the insulator layer 103. In any case, this selective anisotropic etch process should be stop prior to exposing the top surface of the substrate 102. Selective anisotropic etch processes for dielectric materials, such as silicon nitride, silicon oxynitride, silicon oxycarbide, etc., are well known in the art. Thus, the details of such processes have been omitted from this specification in order to allow the reader to focus on the salient aspects of the disclosed method.

It should be understood that the widths of the first sidewall spacers 108 will depend upon the thickness of the conformal layer of first spacer material and the etch rate in the direction parallel to the top surface of the insulator layer 103. It should further be understood that, if a conformal oxide layer 107 (and/or a thermal oxide layer) were formed at process 14, then the first sidewall spacers 108 would be physically separated from the first sidewalls 116 by vertical portions of the conformal oxide layer 107 (as illustrated) and/or the thermal oxide layer. However, if neither a conformal oxide layer 107, nor a thermal oxide layer, is not formed at process 14, then the first sidewall spacers 108 will be immediately adjacent to the first sidewalls 116.

After the first sidewall spacers 108 are formed, but before the trenches $191_1$-$191_4$ are filled-in with isolation materials to form shallow trench isolation (STI) regions therein, one or more semiconductor devices 110a-110c can be formed using the one or more semiconductor mesas 106a-106c (18). Specifically, the semiconductor mesa(s) 106a-106c could be used to form one or more active devices (e.g., field effect transistors (FETs), bipolar junction transistors (BJTs), heterojunction bipolar transistors (HBTs), etc.) and/or one or more passive devices (e.g., resistors, capacitors, diodes, etc.). Optionally, during this process 18 of forming semiconductor device(s) using the semiconductor mesa(s), at least one additional device (e.g., a resistor, an inductor, etc.) can be formed within at least one of the trenches $191_1$-$191_4$ so as to be positioned laterally between two adjacent semiconductor mesas.

For purposes of illustration, process 18 is described in greater detail below using exemplary sub-processes 20-28 to form the following semiconductor devices: a first FET 110a oriented in a first direction and formed using the first semiconductor mesa 106a; a second FET 110b oriented in a second direction perpendicular to the first direction and formed using the second semiconductor mesa 106b; a first resistor 110c (e.g., a silicon resistor) formed using the third semiconductor mesa 106c, and an additional device (e.g., a second resistor 111 and, particularly, a polysilicon resistor)

formed in the trench $191_3$ positioned laterally between the second semiconductor mesa 106b and the third semiconductor mesa 106c.

Figure 6:
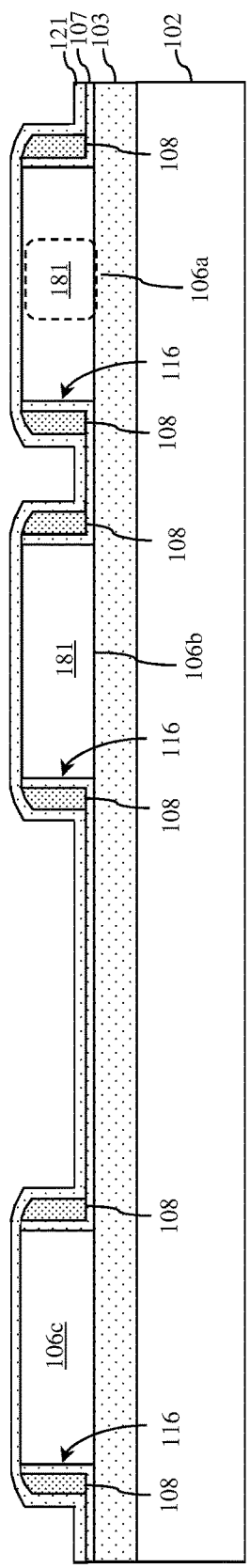
FIG. 6 is a cross-section diagram illustrating a partially completed structure formed according to the flow diagram of FIG. 1.
Figure 7A:
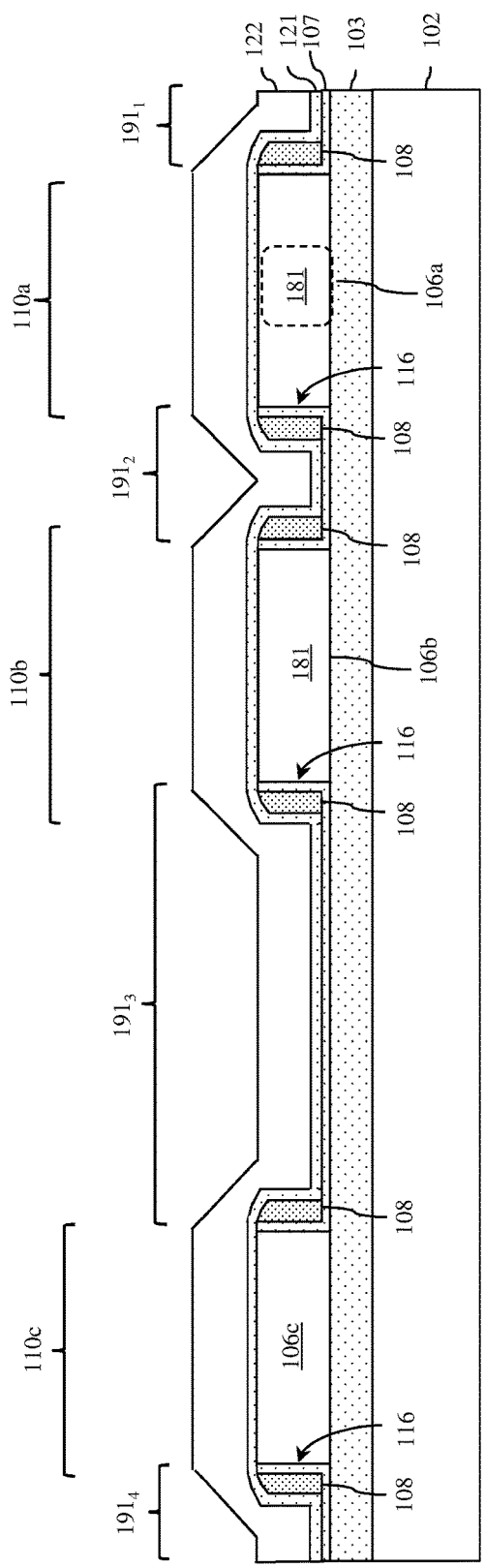
FIGS. 7A and 7B are alternative cross-section diagrams illustrating a partially completed structure formed according to the flow diagram of FIG. 1.
Figure 7B:
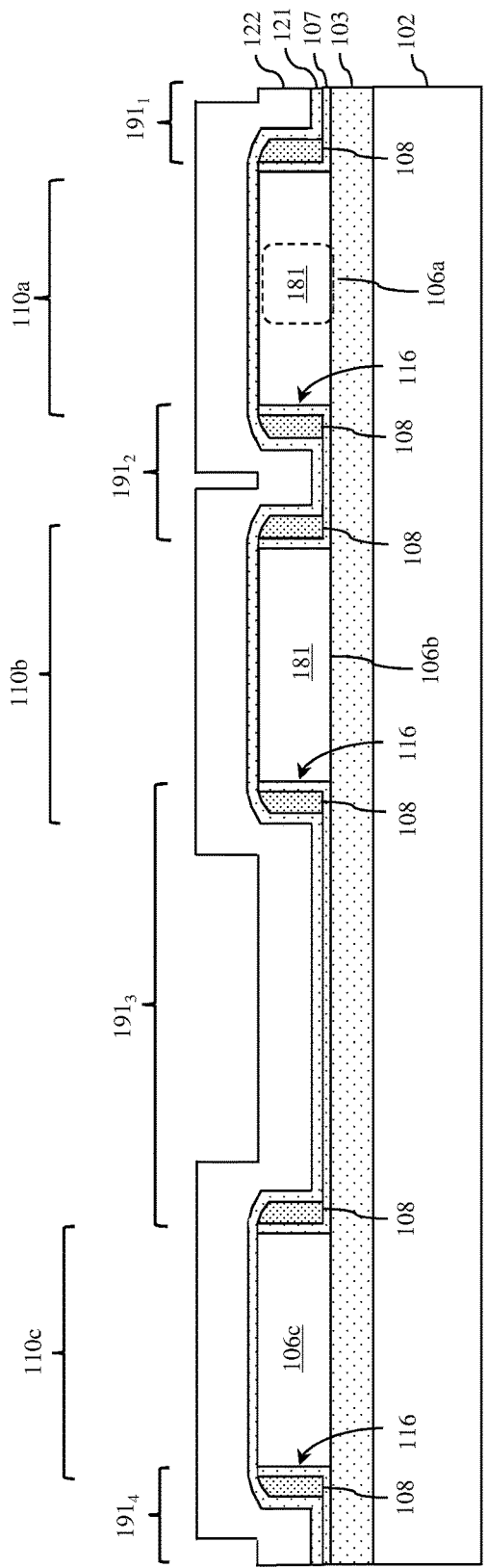

To form semiconductor device(s) using the semiconductor mesa(s) and, optionally, additional device(s) between adjacent semiconductor mesas at process 18, the top surface(s) of the semiconductor mesa(s) can first be cleaned. Specifically, the top surface(s) of the semiconductor mesa(s) are exposed by etching off any dielectric material using, for example, a combination of wet and dry etch chemistries, such as aqueous or vapor hydrofluoric acid (HF). Next, a multi-layer stack is formed over the semiconductor mesa(s) 106a-c (20). Specifically, a gate dielectric layer 121 can be formed over the semiconductor mesa(s). The gate dielectric layer 121 can be made of one or more layers of any suitable gate dielectric material including, but not limited to, silicon dioxide ($SiO_2$) or a high-K dielectric material. In one embodiment, the gate dielectric layer can be an oxide layer. Such an oxide layer can be formed, for example, by depositing a conformal oxide layer over the semiconductor mesa(s) (e.g., using a chemical vapor deposition (CVD) process, an atomic layer deposition (ALD) or any other suitable deposition process), as illustrated in FIG. 6. Alternatively, such an oxide layer can be formed by thermally oxidizing the top surface(s) of the semiconductor mesa. Next, a gate conductor layer 122 can be formed on the gate dielectric layer 121. The gate conductor layer 122 can be made of one or more layers of suitable gate conductor material including, but not limited to, polysilicon or metal. In one embodiment, the gate conductor layer 122 can be a polysilicon layer. Such a polysilicon layer can be a conformal polysilicon layer, as shown in FIG. 7A. Such a conformal polysilicon layer can be formed, for example, using a CVD process such as rapid thermal CVD or liquid phase CVD. Alternatively, the polysilicon layer could be a non-conformal polysilicon layer, as shown in FIG. 7B. Such a non-conformal polysilicon layer could be formed, for example, using a high-density plasma CVD process. In any case, the gate conductor layer 122 can be formed over the semiconductor mesa(s) 106a-106c and within the trenches $191_1$-$191_4$, thereby forming a multi-layer stack.

It should be noted that the multi-layer stack could be formed so that portions of the stack within the trenches $191_1$-$191_4$ have approximately the same height as the semiconductor mesa(s) 106a-c (e.g., as measured from the top surface of the insulator layer 103) (as illustrated), a lesser height, or a greater height. It should further be noted that, optionally, the multi-layer stack could be polished (e.g., using a CMP process) to reduce the height of the stack above the semiconductor mesa(s) 106a-c (e.g., to achieve a desired gate height and/or to improve subsequent contact lithography depth of focus by decreasing the top surface heights of the lowermost, middle, and top silicon layers).

Figure 8:
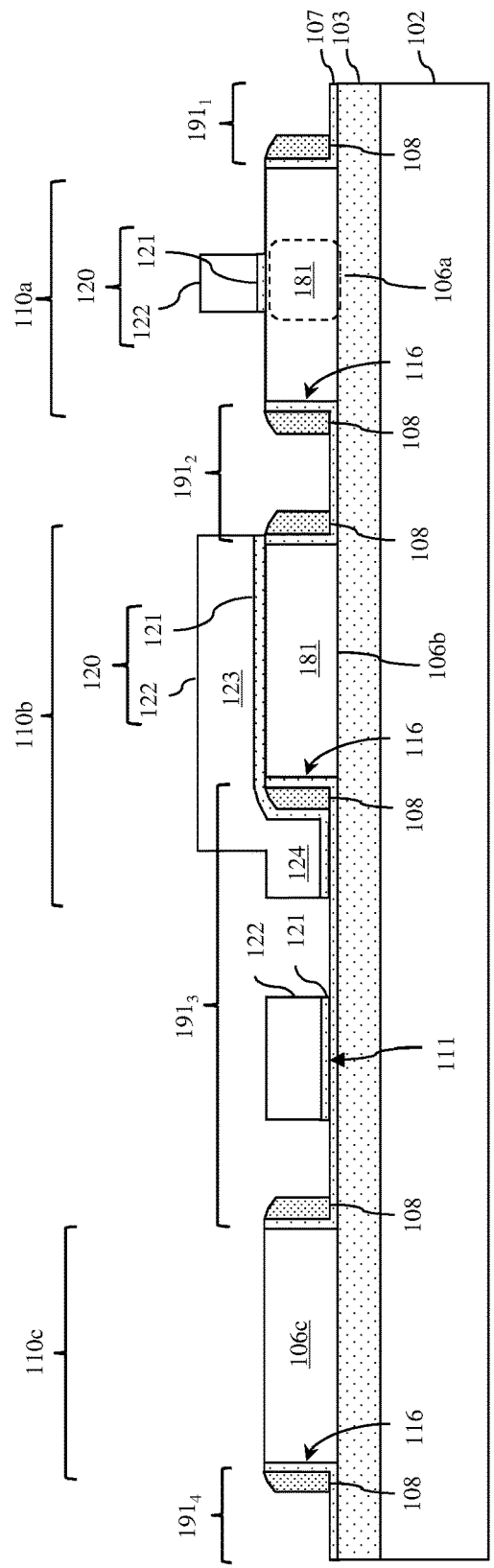
FIG. 8 is a cross-section diagram illustrating a partially completed structure formed according to the flow diagram of FIG. 1.

In any case, the multi-layer stack can then be lithographically patterned and etched to form patterned dielectric 121-conductor 122 shapes (e.g., patterned polysilicon-silicon oxide shapes) (22, see FIG. 8). Specifically, the stack can be lithographically patterned and etched at process 22 so that the resulting patterned shapes form any one or more of the following: a gate for a FET on a semiconductor mesa (e.g., see the gates on the top surface of the first semiconductor mesa 106a for the first FET 110a and on the top surface of the second semiconductor mesa 106b for the second FET 110b); a gate for some other type of semiconductor device such as a MOS capacitor (not shown); and an additional device, such as a resistor, in a trench positioned laterally between adjacent semiconductor mesas (e.g., see the second resistor 111 and, particularly, the polysilicon resistor in the trench $191_3$).

Figure 9:
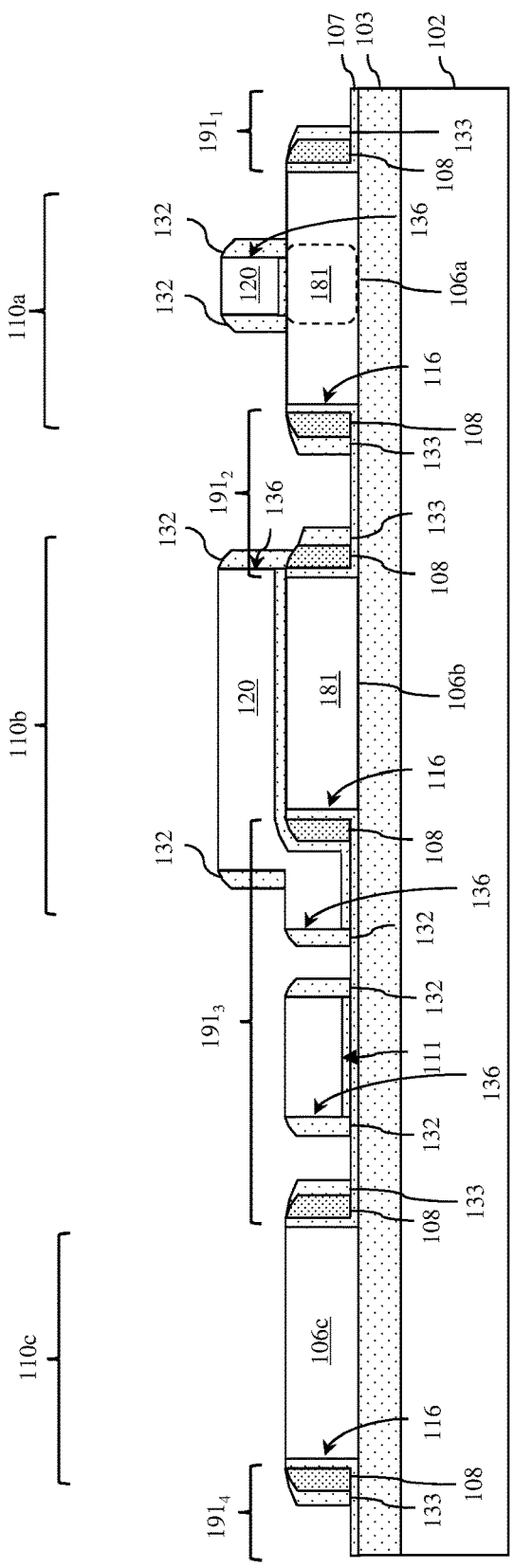
FIG. 9 is a cross-section diagram illustrating a partially completed structure formed according to the flow diagram of FIG. 1.

The method can further include forming additional sidewall spacers on all essentially vertical surfaces (24, see FIG. 9). Specifically, a conformal layer of additional sidewall spacer material can be deposited (e.g., by chemical vapor deposition (CVD)) over the partially completed IC structure. This additional sidewall spacer material can be, for example, any one or more of silicon oxide, silicon oxynitride, silicon oxycarbide, or any other suitable dielectric materials. Thus, the additional sidewall spacer material can be the same dielectric material as that used for the first sidewall spacers 108 or a different dielectric material. In any case, the thickness of the conformal layer of additional sidewall spacer material can range, for example, from 50-100nm. Following deposition of the additional sidewall spacer material, a selective anisotropic etch process can be performed so as to remove the additional sidewall spacer material from horizontal surfaces, leaving the additional sidewall spacer material on vertical surfaces. That is, the additional sidewall spacer material can be etched in at a significantly faster rate in a direction perpendicular to the top surface of the insulator layer 103 as compared to the direction parallel to the top surface of the insulator layer 103. Additionally, the additional sidewall spacer material can be etched selective to (i.e., etched at a significantly faster rate than) the insulator material of the insulator layer 103, the dielectric material of the conformal oxide layer 107 (if present), the semiconductor material of the semiconductor mesas 106a-106c and the polysilicon material of any patterned shapes formed at process 22 (e.g., gates 120 and second resistor 111). As a result, this selective anisotropic etch process will essentially simultaneously form second sidewall spacers 132 positioned laterally immediately adjacent to second sidewalls 136 of the various patterned shapes formed at process 22 (e.g., see second sidewall spacers 132 on the gates 120 and on the second resistor 111) and the third sidewall spacers 133 within the trenches $191_1$-$191_4$ positioned laterally immediately adjacent to the first sidewall spacers 108 (e.g., opposite the first sidewalls 116). As mentioned above, selective anisotropic etch processes for dielectric materials, such as silicon nitride, silicon oxynitride, silicon oxycarbide, etc., are well known in the art. Thus, the details of such processes have been omitted from this specification in order to allow the reader to focus on the salient aspects of the disclosed method.

Figure 10:
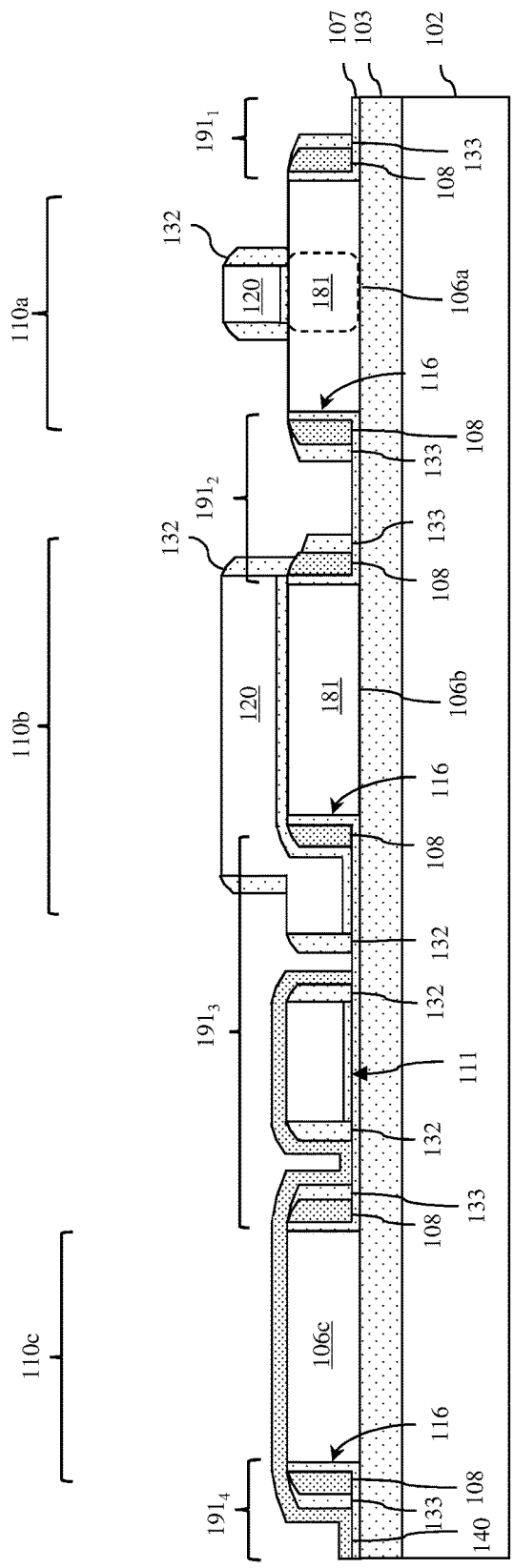
FIG. 10 is a cross-section diagram illustrating a partially completed structure formed according to the flow diagram of FIG. 1.
Figure 11:
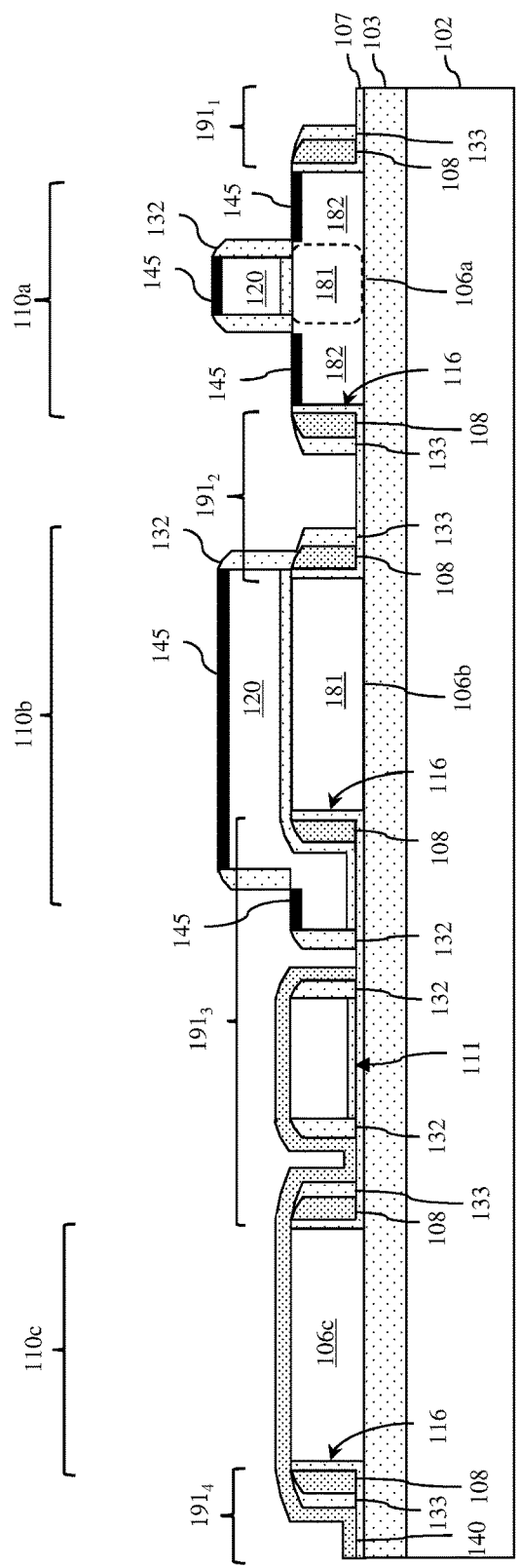
FIG. 11 a is a cross-section diagram illustrating a partially completed structure formed according to the flow diagram of FIG. 1.

Next, a conformal protective layer 140 can be formed over any semiconductor devices that do not require the formation of a self-aligned silicide on exposed silicon surfaces at process 28, discussed in greater detail below (26, see FIG. 10). For example, a conformal protective layer 140 can be deposited and further lithographically patterned and etched so as to cover any devices that do not require the silicide formation (e.g., the silicon resistor 110c and the polysilicon resistor 111) and so as to leave exposed any devices that require silicide formation (e.g., the first FET 110a and the second FET 110b). This conformal protective layer should specifically be a different dielectric material than the additional sidewall spacer material, which was previously used to form the second and third sidewall spacers 132-133, so that the conformal protective layer can be etched without damaging the second and third sidewall spacers 132-133. Additional processing can then be performed, as necessary, to complete the semiconductor devices (28, see FIG. 11). For example, for the first FET 110a and the second FET 110b, this additional processing can include, but is not limited to, dopant implantation processes to form various dopant implant regions (e.g., optional halos (not shown), optional source/drain extensions (not shown), and source/drain regions 182) within the semiconductor mesas 106a and 106b on opposing sides of the channel region 181; self-aligned silicide layer 145 formation on exposed surfaces of the source/drain regions 182 and gates 120; etc. It should be understood that this list of additional processes is offered for illustration purposes and is not intended to be an exhaustive list of all the processing steps required to complete a FET structure. Various other processes could additionally or alternatively be formed depending upon the FET design.

It should be understood that the above-described sub-processes 20-28, which can be used at process 18 to form semiconductor device(s) using the semiconductor mesa(s) and, optionally, additional device(s) between adjacent semiconductor mesas, as well as the accompanying Figures are offered for illustration purposes and are not intended to be limiting. For example, in one embodiment of the method, only a single type of semiconductor device (e.g., an active device or a passive device, as discussed above) could be formed using each of the one or more semiconductor mesas. In other embodiments of the method, different combinations of active device(s) (e.g., field effect transistors (FETs), bipolar junction transistors (BJTs), heterojunction bipolar transistors (HBTs), etc.) and/or passive device(s) (e.g., resistors, capacitors, diodes, etc.) could be formed using the semiconductor mesas. Additionally or alternatively, no additional devices (e.g., polysilicon resistors) could be formed within the trenches or multiple additional devices of the same or different types could be formed within the same or different trenches. Additionally, although only a single semiconductor device is shown as being formed within each semiconductor mesa, multiple semiconductor devices could be formed within the same semiconductor mesa.

Figure 12:
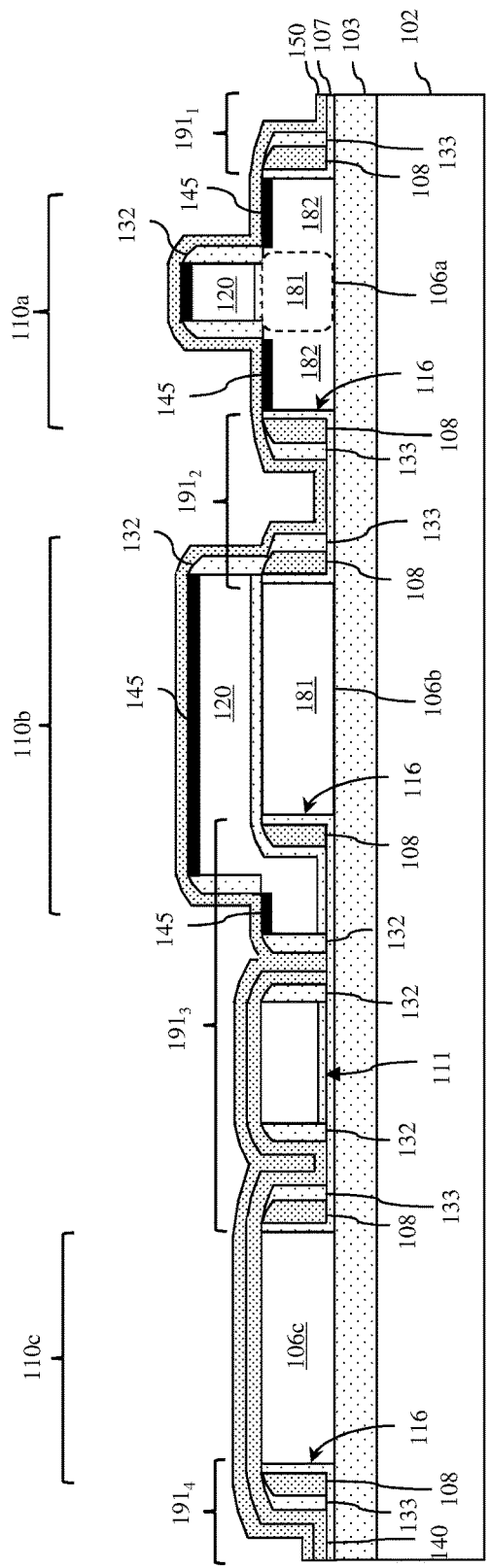
FIG. 12 is a cross-section diagram illustrating a partially completed structure formed according to the flow diagram of FIG. 1.
Figure 13:
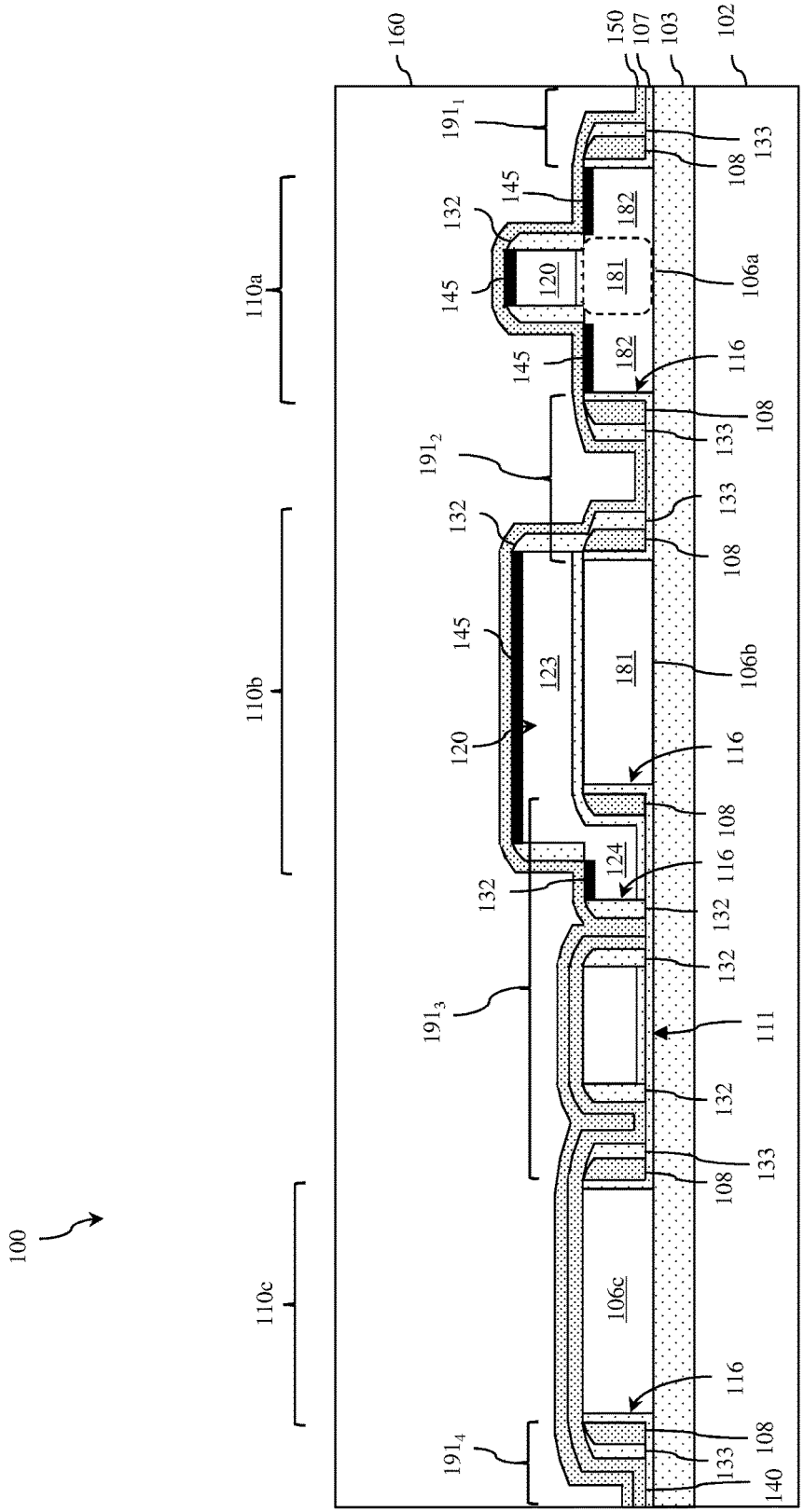
FIG. 13 is a cross-section diagram illustrating a partially completed structure formed according to the flow diagram of FIG. 1.

In any case, following formation of the semiconductor device(s) using the semiconductor mesa(s) and any additional device(s) within the trenches between adjacent semiconductor mesas at process 18, at least one middle of the line (MOL) dielectric layer can be deposited over the various devices and into any remaining spaces within the trenches $191_1$-$191_4$, thereby completing the shallow trench isolation (STI) structures (30, see FIGS. 12-13). For example, a conformal etch stop layer 150 can be deposited over the semiconductor device(s) 110a-c, over any additional device(s) 111 and into any remaining spaces within the trenches $191_1$-$191_4$ (see FIG. 12). A blanket interlayer dielectric (ILD) layer 160 can then be deposited onto the conformal etch stop layer 150 and planarized (e.g., using a chemical mechanical polishing (CMP) process) (see FIG. 13). The conformal etch stop layer 150 can be made, for example, of silicon nitride. The blanket ILD layer 160 can be made of silicon oxide or any other suitable ILD material (e.g., borophosphosilicate glass (BPSG), tetraethyl orthosilicate (TEOS), fluorinated tetraethyl orthosilicate (FTEOS), etc.).

As mentioned above, the MOL dielectric layers (i.e., the conformal etch stop layer 150 and the blanket ILD layer 160) can be deposited into any remaining spaces within the trenches $191_1$-$191_4$ at process 30. Thus, a portion of the MOL dielectric layers (i.e., a portion of the conformal etch stop layer 150 and, depending upon available space, the blanket ILD layer 160) could be deposited into at least some of the trenches $191_1$-$191_4$. For example, the MOL dielectric layers, including the conformal etch stop layer 150 and the blanket ILD layer 160, can fill a relatively large space within a given trench such that the resulting STI contains portions of both the conformal etch stop layer 150 and the ILD layer 160 (e.g., see trenches $191_1$-$191_2$ and $191_4$). However, when the size of a given space remaining within a given trench following device formation is relatively small (e.g., shallow or narrow), the conformal etch stop layer 150 may completely fill that space such that the resulting STI does not contain any portion of the ILD layer 160 (e.g., see trench $191_3$). Furthermore, if the aspect ratio of a given space remaining within a given trench is relatively high, the conformal etch stop layer 150 or the ILD layer 160 may pinch off at the top of that trench may occur such that a void is created within the trench (not shown).

Contacts can subsequently be formed through the MOL dielectric layers to the semiconductor devices and BEOL metal levels can be formed to complete the IC structure (32). Techniques for forming contacts and BEOL metal levels are well known in the art and, thus, the details of these techniques have been omitted from this specification in order to allow the reader to focus on the salient aspects of the disclosed method.

Referring to FIG. 13, also disclosed herein are embodiments of an integrated circuit (IC) structure 100 formed according to the above-described method so as to have sidewall spacer and middle of the line (MOL) dielectric-containing shallow trench isolation (STI) regions. The IC structure 100 can be a semiconductor-on-insulator structure. That is, the IC structure 100 can be formed on a semiconductor-on-insulator wafer (e.g., a silicon-on-insulator (SOI) wafer or any other suitable semiconductor-on-insulator wafer) such that it includes a substrate 102 (e.g., a silicon substrate or any other suitable substrate including, but not limited to, a silica glass substrate or a silicon carbide (SiC) substrate), an insulator layer 103 (e.g., a buried oxide (BOX) layer or other suitable insulator layer) on the substrate 102 and a semiconductor layer (e.g., a silicon layer or any other suitable monocrystalline semiconductor layer) on the insulator layer 103. Those skilled in the art will recognize that the required the thicknesses of the various layers may vary depending upon the application. For example, for radio frequency (RF) applications, the thickness of the semiconductor layer may range from 50-150 nm; whereas, for conventional complementary metal oxide semiconductor (CMOS) applications, the thickness of the semiconductor layer may range from 10-100 nm. Trenches $191_1$-$191_4$ can extend vertically through the semiconductor layer to the insulator layer 103 so as to define one or more semiconductor mesas 106a-106c on the insulator layer 103. Optionally, a relatively thin conformal oxide layer 107 can line the trenches $191_1$-$191_4$. Additionally or alternatively, a thermal oxide layer could be on the trench sidewalls.

Additionally, first sidewall spacers 108 can be within the trenches $191_1$-$191_4$ so as to be positioned laterally adjacent to the first sidewalls 116 of each semiconductor mesa 106a-106c. The first sidewall spacers 108 can be made, for example, of silicon nitride, silicon oxynitride, silicon oxycarbide, alumina or any other suitable dielectric material, which is different than the dielectric material of the insulator layer 103 and the dielectric material of the conformal oxide layer 107 (if present).

The IC structure 100 can further include one or more semiconductor devices (e.g., see semiconductor devices 110a-110c) formed using the one or more semiconductor mesas 106a-106c. Specifically, the IC structure 100 can include one or more active devices (e.g., field effect transistors (FETs), bipolar junction transistors (BJTs), heterojunction bipolar transistors (HBTs), etc.) and/or one or more passive devices (e.g., resistors, capacitors, diodes, etc.). Optionally, the IC structure 100 can further include at least one additional device (e.g., a resistor, an inductor, etc.) within at least one of the trenches $191_1$-$191_4$ so as to be positioned laterally between two adjacent semiconductor mesas.

For purposes of illustration, the IC structure 100 is shown in FIG. 13 and described in greater detail below as including four semiconductor devices: a first FET 110a oriented in a first direction and formed using the first semiconductor mesa 106a; a second FET 110b oriented in a second direction perpendicular to the first direction and formed using the second semiconductor mesa 106b; a first resistor 110c (e.g., a silicon resistor) formed using the third semiconductor mesa 106c, and an additional device (e.g., a second resistor 111 and, particularly, a polysilicon resistor) formed in the trench $191_3$ positioned laterally between the second semiconductor mesa 106b and the third semiconductor mesa 106c.

The IC structure 100 can further include patterned conductor-dielectric shapes (e.g., patterned polysilicon-oxide shapes). Specifically, as discussed in detail above with regard to the method, a multi-layer stack including a dielectric layer (e.g., a silicon oxide layer) and a conductor layer (e.g., a polysilicon layer) can be lithographically patterned and etched to form patterned conductor-dielectric shapes (e.g., polysilicon-oxide shapes). These patterned shapes can include, for example, any one or more of the following: a gate 120 for the first FET 110a on the top surface of the first semiconductor mesa 106a above a channel region 181; a gate for the second FET 110b on the top surface of the second semiconductor mesa 106b above a channel region 181; a gate for some other type of semiconductor device (not shown); and an additional device in a trench positioned laterally between adjacent semiconductor mesas (e.g., see the second resistor 111 and, particularly, the polysilicon resistor in the trench $191_3$).

As mentioned above, the first FET 110a and the second FET 110b and, thus, their respective gates are oriented in different directions. The diagram of FIG. 13 shows a vertical cross-section that extends across the length of the first FET 110a and across the width of the second FET 110b at the channel region 181. As illustrated with respect to the second FET 110b, a gate 120 can, optionally, be lithographically patterned and etched so as to have a first portion 123, which is on the top surface of the semiconductor mesa and which traverses the channel region 181, and a second portion 124, which extends laterally over the first sidewall spacer 108 and into at least one adjacent trench (e.g., see trench $193_3$). This allows for a gate contact to be vertically aligned over insulator material, as opposed to being directly over the channel region 181, if desired.

It should be noted that the patterned conductor-dielectric shapes or portions thereof within the trenches $191_1$-$191_4$ (e.g., the second resistor 111 or second portion 124 of the gate of the second FET 110) can have approximately the same height as the semiconductor mesa(s) 106a-c (e.g., as measured from the top surface of the insulator layer 103) (as illustrated), a lesser height, or a greater height. It should further be noted that, optionally, the patterned conductor-dielectric shapes or portions thereof on the top surfaces of the semiconductor mesas (e.g., the gate of the first FET 110a and the first portion 123 of the gate of the second FET 110b) could have the same thicknesses as the patterned conductor-dielectric shapes or portions thereof within the trenches (as illustrated) or could be polished during processing to reduce their height above the semiconductor mesa(s) (e.g., to achieve a desired gate height and/or to improve subsequent contact lithography depth of focus by decreasing the top surface heights of the lowermost, middle, and top silicon layers).

The IC structure 100 can further have additional sidewall spacers including second sidewall spacers 132 positioned laterally immediately adjacent to second sidewalls 136 of the patterned polysilicon dielectric shapes (i.e., gates 120 and any additional devices, such as the second resistor 111) and the third sidewall spacers 133 within the trenches 1911-1914 positioned laterally immediately adjacent to the first sidewall spacers 108 (e.g., opposite the first sidewalls 116). The additional sidewall spacers (i.e., the second sidewall spacers 132 and the third sidewall spacers 133) can be made, for example, of silicon oxide, silicon oxynitride, silicon oxycarbide, or any other suitable dielectric material. Thus, the additional sidewall spacers can be made of the same dielectric material as that used for the first sidewall spacers 108 or a different dielectric material.

The IC structure 100 can further include a conformal protective layer 140 over only some of the semiconductor devices (e.g., the first resistor 110c and the second resistor 111). This conformal protective layer 140 can be made, for example, of silicon nitride and can specifically be made of a different dielectric material than the second sidewall spacers 132 and the third sidewall spacers 133. As discussed in detail above, this conformal protective layer 140 provides protection to some semiconductor devices (e.g., the resistors 110c and 111) during processing (e.g., during self-aligned silicide formation, etc.) of other semiconductor devices (e.g., the first FET 110a and the second FET 110b).

It should be understood that FIG. 13 is not intended to be limiting. As mentioned above the IC structure 100 can include one or more semiconductor devices formed using the one or more semiconductor mesas 106a-106c and, optionally, one or more additional devices within at least one of the trenches $191_1$-$191_4$ so as to be positioned laterally between two adjacent semiconductor mesas. Thus, instead of being configured as described above and illustrated in FIG. 13, the IC structure 100 can include different combinations of one or more active devices (e.g., field effect transistors (FETs), bipolar junction transistors (BJTs), heterojunction bipolar transistors (HBTs), etc.) and/or one or more passive devices (e.g., resistors, capacitors, diodes, etc.) formed using the semiconductor mesas. Additionally or alternatively, the IC structure 100 could include no additional devices (e.g., polysilicon resistors) within the trenches or multiple additional devices of the same or different types within the same or different trenches. Additionally, although only a single semiconductor device is shown as being formed using each semiconductor mesa, the IC structure 100 could include multiple semiconductor devices formed using the same semiconductor mesa.

In any case, the IC structure 100 can further include at least one middle of the line (MOL) dielectric layer. For example, the MOL dielectric layers can include a conformal etch stop layer 150 that covers the semiconductor device(s) 110a-c and any additional device(s) 111 and a blanket interlayer dielectric (ILD) layer 160 on the conformal etch stop layer 150. The conformal etch stop layer 150 can be made, for example, of silicon nitride. The blanket ILD layer 160 can be made of silicon oxide or any other suitable ILD material (e.g., borophosphosilicate glass (BPS G), tetraethyl orthosilicate (TEOS), fluorinated tetraethyl orthosilicate (FTEOS), etc.).

As discussed above with regard to the methods, the MOL dielectric layers can be deposited after device formation into any remaining spaces in the trenches $191_1$-$191_4$ positioned laterally adjacent to the semiconductor device(s) 110a-c and/or containing the additional device(s) 111. Thus, a portion of the MOL dielectric layers (i.e., a portion of the conformal etch stop layer 150 and, depending upon available space, the blanket ILD layer 160) could be within at least some of the trenches $191_1$-$191_4$. For example, the MOL dielectric layers, including the conformal etch stop layer 150 and the blanket ILD layer 160, can fill a relatively large space within a given trench such that the resulting STI contains portions of both the conformal etch stop layer 150 and the ILD layer 160 (e.g., see trenches $191_1$-$191_2$ and $191_4$). However, when the size of a given space remaining within a given trench following device formation is relatively small (e.g., shallow or narrow), the conformal etch stop layer 150 may completely fill that space such that the resulting STI does not contain any portion of the ILD layer 160 (e.g., see trench $191_3$). Furthermore, if the aspect ratio of a given space remaining within a given trench is relatively high, the conformal etch stop layer 150 or the ILD layer 160 may pinch off at the top of that trench may occur such that a void is created within the trench (not shown).

Therefore, the IC structure 100 can have at least one STI region that includes: an optional silicon oxide liner 107, first sidewall spacers 108 on the liner positioned laterally adjacent to sidewalls 116 of the adjacent semiconductor mesas; third sidewall spacers 133 positioned laterally adjacent to the first sidewall spacers 108; the conformal etch stop layer 150; and the blanket ILD 160 filling any remaining space (e.g., see the STI regions in the trenches $191_1$ and $191_2$). The IC structure 100 can, additionally or alternatively, have at least one STI region that includes some or all of these same features as well as an additional device embedded therein (e.g., see the second resistor 111 embedded in the STI region in the trench $191_3$).

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). As used herein, the phrase "positioned laterally" refers to an element be positioned to one side of another element as opposed to above or below the other element as they are oriented in the drawings. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:

providing a semiconductor-on-insulator wafer comprising a substrate, a semiconductor layer on the substrate and an insulator layer on the semiconductor layer;

forming trenches in the semiconductor layer to define multiple semiconductor mesas on the insulator layer, wherein the semiconductor mesas having first sidewalls and top surfaces;

forming, within the trenches, first sidewall spacers positioned laterally adjacent to the first sidewalls of the semiconductor mesas, wherein the forming of the first sidewall spacers comprises:
 depositing a conformal layer of sidewall spacer material in the trenches and over the semiconductor mesas; and
 performing a selective anisotropic etch process to remove the sidewall spacer material from above the top surfaces of the semiconductor mesas;

after the forming of the first sidewall spacers, forming devices using the semiconductor mesas and, during the forming of the devices, forming an additional device within a trench positioned laterally between adjacent semiconductor mesas, wherein the forming of the devices comprises forming a field effect transistor using a first semiconductor mesa and wherein the forming of the field effect transistor comprises forming a gate on a top surface of the first semiconductor mesa after the forming of the first sidewall spacers; and, depositing a blanket interlayer dielectric layer, wherein the first sidewall spacers and the interlayer dielectric layer comprise different dielectric materials, wherein the forming of the devices further comprises forming a first resistor using a second semiconductor mesa, wherein the forming of the additional device comprises forming a second resistor, wherein the forming of the devices and the forming of the additional device comprise:
 depositing a silicon oxide layer;
 depositing a polysilicon layer on the silicon oxide layer to form a multi-layer stack; and
 patterning the multi-layer stack to form polysilicon-silicon oxide shapes, the polysilicon-silicon oxide shapes including:
  the gate for the field effect transistor on the top surface of the first semiconductor mesa; and
  the second resistor, and wherein the method further comprises:
 essentially simultaneously forming second sidewall spacers and third sidewall spacers such that the second sidewall spacers are positioned laterally adjacent to second sidewalls of the polysilicon-silicon oxide shapes and such that the third sidewall spacers are within the trenches positioned laterally adjacent to the first sidewall spacers, wherein the second sidewall spacers and the third sidewall spacers comprise a different dielectric material than the first sidewall spacers;
forming a protective layer over the first resistor and the second resistor;
performing a dopant implantation process to form source/drain regions for the field effect transistor in the first semiconductor mesa; and,
forming silicide layers on the source/drain regions.

2. The method of claim 1, wherein the first sidewall spacers comprise silicon nitride.

3. The method of claim 1, wherein the depositing of the blanket interlayer dielectric layer further comprises depositing the blanket interlayer dielectric layer within at least some of the trenches and above the additional device and the devices.

4. The method of claim 1, further comprising, before the depositing of the blanket interlayer dielectric layer, depositing a conformal etch stop layer, wherein the conformal etch stop layer comprises a different dielectric material than the blanket interlayer dielectric layer.

5. The method of claim 1, wherein the gate has a first portion above the top surface of the first semiconductor mesa and a second portion within an adjacent trench.

6. A method comprising:
forming trenches in a semiconductor layer to define at least one semiconductor mesa, the semiconductor mesa having first sidewalls;
forming first sidewall spacers within the trenches and positioned laterally adjacent to the first sidewalls of the semiconductor mesa;
after the forming of the first sidewall spacers and before completely filling the trenches, forming a device using the semiconductor mesa, wherein the forming of the device comprises forming a gate on a top surface of the semiconductor mesa and wherein the gate has a first portion above the top surface of the semiconductor mesa and a second portion within an adjacent trench; and,
depositing a blanket interlayer dielectric layer, wherein the first sidewall spacers and the blanket interlayer dielectric layer comprise different dielectric materials,
wherein the method further comprises, after the forming of the device and before the depositing of the blanket interlayer dielectric layer, essentially simultaneously forming second sidewall spacers and third sidewall spacers such that the second sidewall spacers are positioned laterally adjacent to second sidewalls of the gate and such that the third sidewall spacers are within the trenches positioned laterally adjacent to the first sidewall spacers, and
wherein the second sidewall spacers and the third sidewall spacers comprise a different dielectric material than the first sidewall spacers.

7. The method of claim 6, wherein the first sidewall spacers comprise silicon nitride.

8. The method of claim 6, wherein the depositing of the blanket interlayer dielectric layer further comprises depositing the blanket interlayer dielectric layer within the trenches and above the device.

9. The method of claim 6, further comprising, before the depositing of the blanket interlayer dielectric layer, forming a conformal etch stop layer over the device and within the trenches, wherein the conformal etch stop layer comprises a different dielectric material than the blanket interlayer dielectric layer.

* * * * *